(12) United States Patent
Glenn et al.

(10) Patent No.: US 6,627,987 B1
(45) Date of Patent: Sep. 30, 2003

(54) CERAMIC SEMICONDUCTOR PACKAGE AND METHOD FOR FABRICATING THE PACKAGE

(75) Inventors: Thomas P. Glenn, Gilbert, AZ (US); Roy D. Hollaway, Chandler, AZ (US); Steven Webster, Manila (PH)

(73) Assignee: Amkor Technology, Inc., Chandler, AZ (US)

(*) Notice: Subject to any disclaimer, the term of this patent is extended or adjusted under 35 U.S.C. 154(b) by 0 days.

(21) Appl. No.: 09/881,343

(22) Filed: Jun. 13, 2001

(51) Int. Cl.[7] .................. H01L 23/48; H01L 23/04; H01L 23/12; H03H 11/00; H03H 9/02
(52) U.S. Cl. .................. 257/704; 257/707; 257/703; 257/680; 257/774; 257/797; 257/705; 257/729; 257/706; 257/710; 428/76
(58) Field of Search .................. 257/704, 707, 257/703, 680, 774, 797, 710, 705, 729, 706, 77; 428/76

(56) References Cited

U.S. PATENT DOCUMENTS

| | | | | | |
|---|---|---|---|---|---|
| 4,577,056 A | * | 3/1986 | Butt | .................. | 174/52.4 |
| 4,640,436 A | * | 2/1987 | Miyoshi et al. | .................. | 220/359 |
| 4,882,212 A | * | 11/1989 | SinghDeo et al. | .................. | 428/76 |
| 5,023,624 A | * | 6/1991 | Heckaman et al. | .................. | 343/860 |
| 5,500,628 A | * | 3/1996 | Knecht | .................. | 361/746 |
| 5,532,513 A | * | 7/1996 | Smith et al. | .................. | 257/703 |
| 5,723,904 A | * | 3/1998 | Shiga | .................. | 257/698 |
| 5,767,447 A | * | 6/1998 | Dudderar et al. | .................. | 361/760 |
| 5,793,104 A | * | 8/1998 | Kirkman | .................. | 257/704 |
| 5,814,880 A | * | 9/1998 | Costello et al. | .................. | 257/678 |
| 5,838,093 A | * | 11/1998 | Sakai et al. | .................. | 310/348 |
| 5,861,670 A | * | 1/1999 | Akasaki | .................. | 257/737 |
| 5,889,322 A | * | 3/1999 | Hamada et al. | .................. | 257/701 |
| 6,059,477 A | * | 5/2000 | Dunlap, Jr. et al. | .................. | 29/453 |
| 6,113,730 A | * | 9/2000 | Ohya et al. | .................. | 156/307.3 |
| 6,249,049 B1 | * | 6/2001 | Kamada et al. | .................. | 257/703 |
| 6,262,477 B1 | * | 7/2001 | Mahulikar et al. | .................. | 257/698 |
| 6,271,579 B1 | * | 8/2001 | Going et al. | .................. | 257/664 |
| 6,335,669 B1 | * | 1/2002 | Miyazaki et al. | .................. | 257/723 |
| 6,369,324 B1 | * | 4/2002 | Tomie | .................. | 174/52.1 |
| 6,437,412 B1 | * | 8/2002 | Higuchi et al. | .................. | 257/416 |
| 6,507,102 B2 | * | 1/2003 | Juskey et al. | .................. | 257/706 |
| 2001/0023533 A1 | * | 9/2001 | Sylvester | .................. | 29/830 |
| 2001/0038140 A1 | * | 11/2001 | Karker et al. | .................. | 257/666 |
| 2002/0024130 A1 | * | 2/2002 | Matsuo et al. | .................. | 257/700 |

FOREIGN PATENT DOCUMENTS

| | | | |
|---|---|---|---|
| JP | 59-180514 | * | 10/1984 |
| JP | 2000-228451 | * | 8/2000 |
| JP | 2001-102468 | * | 4/2001 |
| JP | 2001-102888 | * | 4/2001 |

* cited by examiner

*Primary Examiner*—Alexander O. Williams
(74) *Attorney, Agent, or Firm*—Bever, Hoffman & Harms, LLP; James E. Parsons, Esq.

(57) ABSTRACT

A sealed ceramic package for a semiconductor device and a method of fabricating the same are disclosed. In one embodiment, a ceramic substrate has a set of cavities each having an opening at a substrate top surface. A semiconductor die is disposed within each cavity, and is electrically connected through the substrate to input/output terminals of the substrate. The substrate has a metal film on the top surface thereof around the opening of the respective the cavities. A metal lid panel, covering the cavity openings, is soldered to the metal film by reflowing a layer of solder disposed over a lid panel bottom surface, thereby sealing the die in each cavity. Subsequently, individual packages are singulated from the ceramic substrate.

19 Claims, 3 Drawing Sheets

CERAMIC SEMICONDUCTOR PACKAGE AND METHOD FOR FABRICATING THE PACKAGE

BACKGROUND

1. Field of the Invention

The present invention relates to semiconductor packaging, and more particularly to a ceramic semiconductor package and a method for fabricating such a package.

2. Description of the Related Art

Ceramic semiconductor packages, such as Ceramic Ball Grid Array ("CBGA")/Ceramic Land Grid Array ("CLGA") packages, typically use a cofired alumina ceramic substrate to support a semiconductor chip and possibly other electronic devices. The ceramic substrate is fabricated by screening refractory metal paste into traces and vias on and through alumina-based green sheets. The various green sheets are laminated together and sintered at high temperatures. Once sintered, the portions of the traces may be plated with nickel and gold. Subsequently, the semiconductor die is attached to the ceramic substrate and is electronically connected to the traces. Finally, a lid or some sort of an encapsulant encloses the die. Often, the die is located in a cavity of the substrate and covered with a metal lid.

Conventional methods of sealing the cavity of such ceramic substrate packages may cause unacceptable amounts of solder to enter into the cavity, which may interfere with the semiconductor components disposed therein.

A need exists, therefore, for a sealed hermetic ceramic semiconductor package that does not allow unacceptable amounts of solder to enter the cavity during the soldering process.

SUMMARY OF THE INVENTION

A sealed ceramic semiconductor package is provided that includes a ceramic substrate having planar top and bottom surfaces with a cavity open at a substrate top surface. A semiconductor die is disposed within the cavity and is electrically coupled through the substrate to input/output terminals disposed adjacent the substrate bottom surface. A metal film is disposed on a major portion of the planar substrate top surface and around the cavity and a flat metal lid is positioned over the cavity and metal film. A layer of solder is disposed between, coextensive with, and connecting all juxtaposed regions of the metal lid and the metal film to permit sealing of the cavity by soldering the metal lid to the metal film with the layer of solder.

In one embodiment, a sealed ceramic semiconductor package may be fabricated by initially providing a ceramic substrate having opposing planar top and bottom surfaces, a plurality of cavities each having an opening at the substrate top surface, and a metal film disposed over the substrate top surface surrounding the cavity. Next, a semiconductor die may be mounted in each of the cavities and electrically coupled through the substrate to input/output terminals of the substrate. A metal lid panel having a layer of solder disposed over a surface thereof is placed over the substrate top surface so as to cover the cavities and juxtapose the solder layer with the metal film. The lid panel is then soldered to the metal film by melting the layer of solder. Lastly, a plurality of packages may be singulated by severing the ceramic substrate and the lid panel.

Accordingly, the present ceramic semiconductor package and method of fabricating the same provide a sealed ceramic semiconductor package that may be fabricated with little, if any, solder entering the cavity of the package during the soldering process. These and other aspects, features, and capabilities will be clear from of the following detailed description and the accompanying drawings.

BRIEF DESCRIPTION OF THE DRAWINGS

In the drawings, the common features across the drawings typically have the same reference numerals.

DETAILED DESCRIPTION

Figure 1:
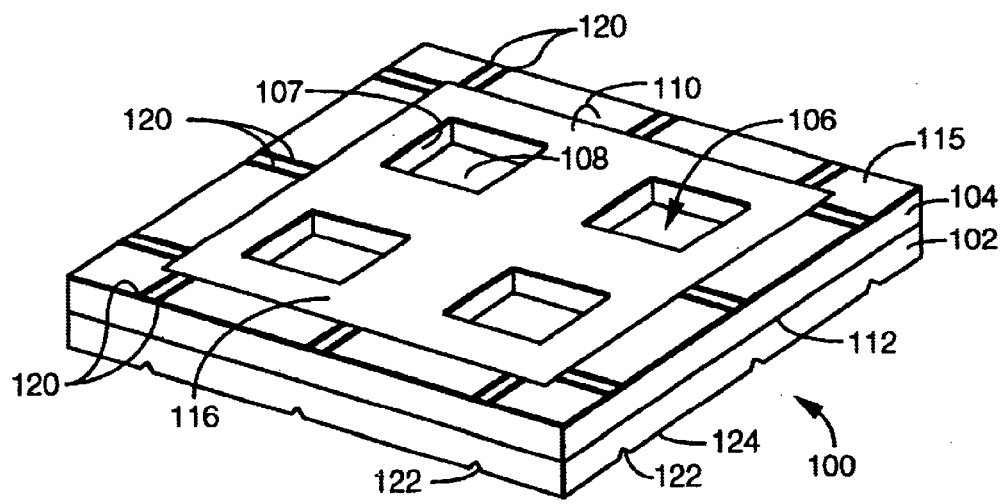
FIG. 1 is an isometric view of a ceramic substrate for making a plurality of semiconductor packages in accordance with one embodiment of the present invention.

FIG. 1 illustrates a multi-layer ceramic substrate 100 in accordance with one embodiment of the present invention. The ceramic substrate 100 includes a ceramic lower layer 102 and a ceramic upper layer 104. Layer 104 has a plurality of rectangular apertures extending vertically therethrough. To form the ceramic substrate 100, the layers 102 and 104 are pressed together while in a green state and then are fired in a manner that melts the layers together. Of course, the number of layers of ceramic used to make the ceramic substrate may vary.

The ceramic substrate 100 includes a two-by-two matrix of four sites for the assembly of a semiconductor package. A cavity 106 is provided at each site. The number of assembly sites formed on the ceramic substrate 100 may vary. The cavity 106 at each site is formed through the layer 104 and extends between top and bottom surfaces 110 and 112 of the layer 104. The cavities 106 are rectangular in cross-section, and are defined by inner side walls 107 and top surface 108 of the lower layer 102, which forms the bottom of the cavity. Cavities 106 are open at the top surface 110 of the top layer 104. The cavities 106 are of sufficient size to accommodate disposition of a semiconductor chip therein.

Additionally, the top surface 110 of the top layer 104 has a uniform layer of a conductive metal film 116 disposed thereon. In one embodiment, the metal film 116 is formed of nickel. Optionally, the metal film 116 covers a major central portion of the top surface 110, including the region in which the cavities 106 are formed. The metal film 116 fully surrounds the upper open end of each of the cavities 106. The metal film 116 does not cover a peripheral region 115 of the top surface 110. In particular, the metal film 116 is circumscribed by the peripheral region 115 of the top surface 110 that is free of the metal film 116.

The peripheral region 115 of the top surface 110 may include a plurality of metal lines 120 directed perpendicular to the peripheral sides 115 of the substrate 100 that can serve as alignment marks for later sawing the substrate 100 into a set of discrete packages. Details regarding such a sawing embodiment are discussed in more detail below. In FIG. 1, pairs of lines 120 extend perpendicularly from the edge of the top surface 110 of the top layer 104 to the peripheral edges of the metal layer 116. Each pair of lines 120 is aligned with another pair of lines 120 on the opposite side of the metal layer 116. Lines 120 can be scribed or etched into the top surface 110 or may be formed by applying a marking material (e.g. metal) onto the top surface 110.

Further, notches 122 are formed in the bottom surface 124 of the lower layer 102. As discussed in more detail below, the notches 122 are formed transversely and longitudinally in the bottom surface 124 of layer 102 to facilitate separating the various packages, such as by snapping them off from each other along the notches 122. Each notch 122 extends either the entire length or width of the bottom surface 124 and is disposed adjacent a row or a column of the cavities 106. A rectangle formed by two intersecting pairs of parallel lines of notches 122 surrounds each package assembly site. In one embodiment, the notches 122 are formed in the lower layer 102 before the lower layer 102 is fired, that is, while the lower layer 102 is still in the green, or unfired, state.

Figure 2:
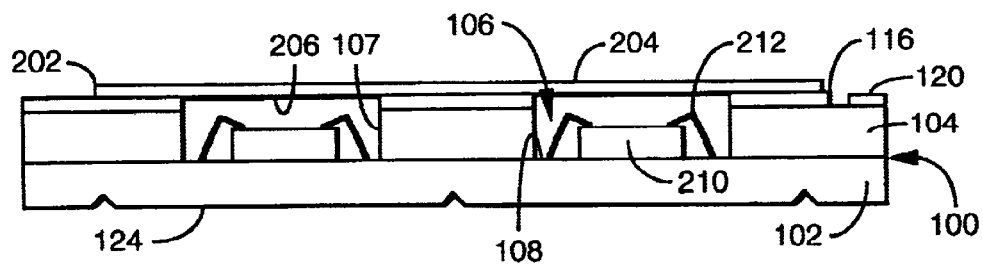
FIG. 2 is a cross-sectional side view of the ceramic substrate of FIG. 1 with semiconductor die and a lid panel disposed thereon in accordance with one embodiment of the present invention.
Figure 3:
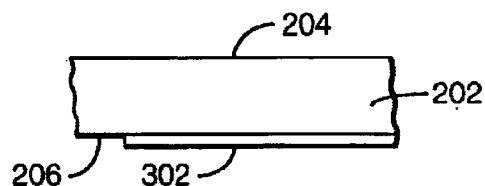
FIG. 3 is a cross-sectional side breakaway view of the lid panel of FIG. 2.

FIG. 2 illustrates, in a side cross-sectional view, the ceramic substrate 100 of FIG. 1 with a lid panel 202 centrally disposed thereon. The lid panel 202 is flat and may be formed of nickel, copper, or some other metal. The lid panel 202 includes opposing top and bottom surfaces 204 and 206. The bottom surface 206 of the lid panel 202 is about the same area as the area covered by the metal film 116 and is slightly smaller in area than the area of the substrate top surface 110. Accordingly, the lid panel 202 superimposes metal film 116, and all of the cavities 106, but does not cover the peripheral region 115 of the top surface 110 so that the opposing pairs of lines 120 remain visible for use as alignment marks in subsequent sawing.

Referring to FIGS. 2, 3, 6, and 7 a thin layer of solder 302 is disposed over substantially the entire area of the bottom surface 206 of the lid panel 202. Bottom surface 206 of lid panel 202 is soldered to the metal film 116 of the top surface 110 of the substrate 100 so that the solder layer 302 is between and coextensive with the juxtaposed regions of the metal lid panel 202 and the metal film 116. The solder may comprise a low-temperature solder, such as lead tin solder, gold tin solder, lead tin indium, or the like. In one embodiment, the solder layer 302 is plated on the bottom surface 206 to a thickness of about 20–150 micro-inches (about 0.5–3.8 micrometers).

Alternatively, the solder layer 302 may be disposed on the lid panel 202 in a pattern that mirrors the metal film 116. That is, there may be open rectangular regions, or apertures, provided in the solder layer 302 at locations corresponding to the locations of the cavities 106.

Figure 5:
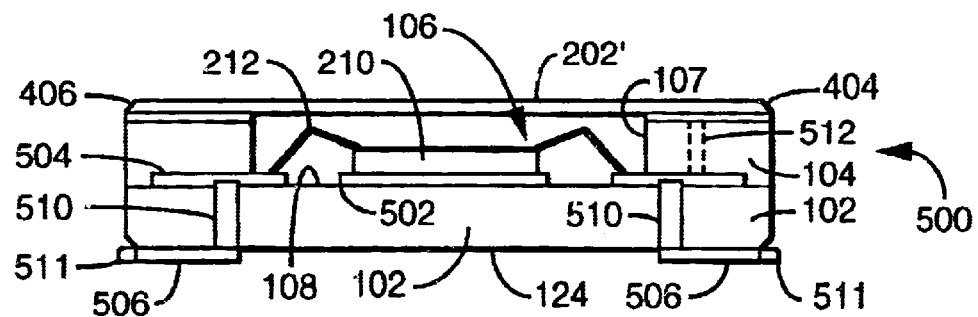
FIG. 5 is a cross-sectional side elevation view of a FIG. 4 semiconductor package after separation from the other packages.
Figure 6:
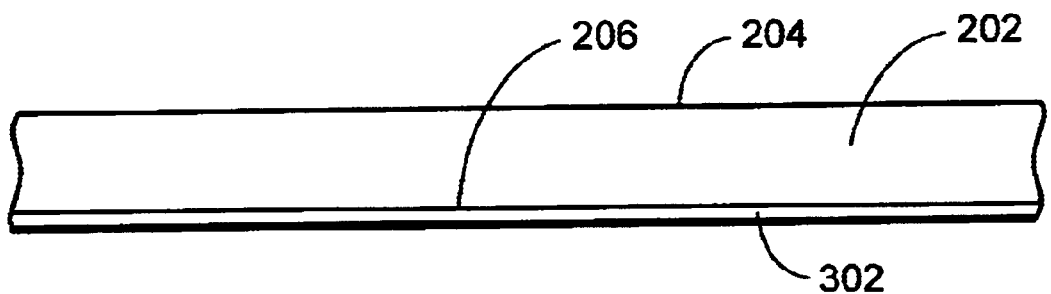
FIG. 6 is a cross-sectional side elevation view of the lid panel according to an embodiment of the invention.
Figure 7:
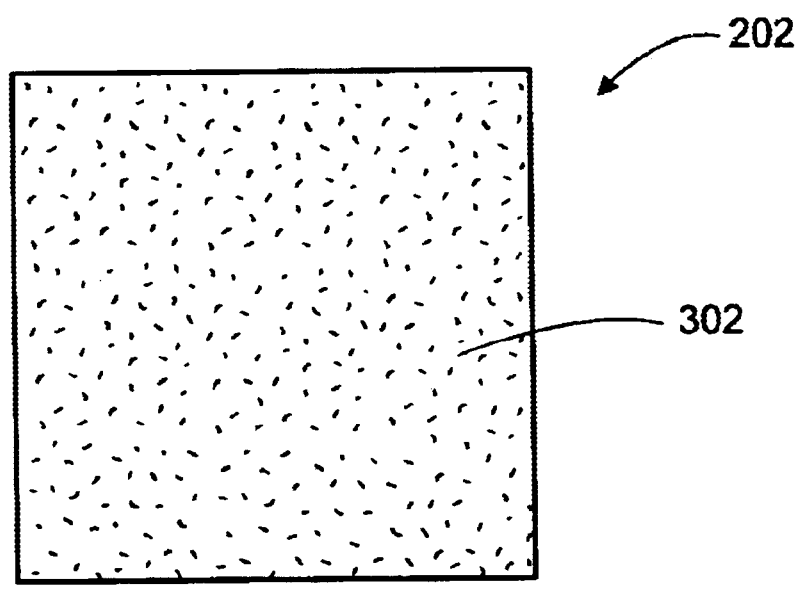
FIG. 7 is a bottom plan view of the lid panel according to an embodiment of the invention.

With continued reference to FIG. 2, a semiconductor die 210 is disposed in each of the cavities 106 on the top surface 108 of the lower ceramic layer 102. Each die 210 is electrically connected by electrical conductors 212, such as bond wires, to conductive paths disposed on the ceramic substrate 100. Details regarding such conductive paths are illustrated in FIG. 5 and discussed below.

Referring again to FIG. 2, the lid panel 202 may be connected to the ceramic substrate 100 over the cavities 106 by soldering the lid panel 202 to the metal film 116. Typically, this soldering is done by melting and then solidifying the layer of solder 302 originally disposed on the bottom surface 206. The lid panel 202 may be soldered to the ceramic substrate 100 by seam welding, or by running a heated roller over the lid. The heated roller applies heat and pressure and thereby presses the lid panel 202 on the substrate 100 while melting the solder. Alternatively, the lid panel 202 may be clipped to the ceramic substrate 100 so that the bottom surface 206 is juxtaposed with the metal film 116. The lid panel 202 and ceramic substrate 100 are then heated in a furnace to solder the lid panel 202 to the metal layer 116 on the top surface 110 of the ceramic substrate 100.

Soldering the lid panel 202 to the metal layer 116 of the ceramic substrate 100, as described above, provides a hermetic seal to the cavities 106 without permitting unacceptable amounts of solder to enter the cavity 106. In some applications, it may be desirable to invert the substrate 100 so that the lid surface 204 of the lid panel 202 faces in a downward direction (i.e. in the direction of gravity) during the soldering process. Such an inversion will further prevent molten solder from entering the respective cavities 106 during the soldering process.

Figure 4:
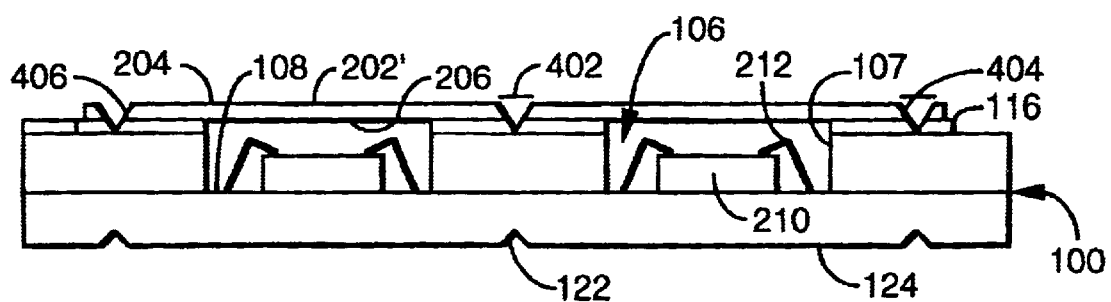
FIG. 4 is a cross-sectional side view of the ceramic substrate of FIG. 3 with optional grooves formed in the lid panel.

FIG. 4 illustrates the ceramic substrate 100 with the lid panel 202 soldered thereto. Optional slots 402 may be transversely and longitudinally cut through the lid 202, the solder layer 302, and the metal film 116 to electrically isolate each incomplete, unsingulated package for parallel electrical testing of the packages. The slots 402 may each comprise beveled edges 404 and 406, which extend fully through the lid panel 202, the solder layer 302, and the metal film 116. Thus, in the configuration illustrated in FIG. 4, each die 210 is electrically isolated from the other die 210 even if the singulated metal lid 202' (see also FIG. 5) is electrically coupled to the particular die 210. Accordingly, each incomplete package 500 may be electrically tested in a parallel testing process before the ceramic substrate 100 is divided into separate packages 500.

Lastly, the ceramic substrate 100 is divided into individual semiconductor packages, such as the package 500 of FIG. 5. The ceramic substrate 100 may be cut, such as by sawing, along the notches 122 and between the opposing pairs of the metal lines 120 (FIG. 1) to divide the ceramic substrate 100 into the individual packages 500. Alternatively, the ceramic substrate 100 may be divided into individual packages by snapping the substrate along the notches 122 and lines 120.

FIG. 5 illustrates a package 500 singulated from the ceramic substrate 100 of FIG. 4 and formed using the methods described herein. The semiconductor die 210 is placed on the top surface 108 of the lower layer 102 of the ceramic substrate 100 by conventional pick and place techniques, and may be attached thereto by an adhesive layer, film, or tape.

As mentioned, each of the four package assembly sites of the ceramic substrate 100 includes electrically conductive paths, including metal traces and metal vias, that electrically connect the die 210 to input/output terminals on the bottom surface 124 of the bottom layer 102 of the ceramic substrate 100. In the embodiment of FIG. 5, traces 504 are disposed on the top surface 108 of the layer 102 and extend into the cavity 106. Electrical conductors 212, which are bond wires in this example, electrically connect the inner end of traces 504 to the semiconductor die 210. Vias 510 extend vertically through the layer 102 and electrically connect the traces 504 to traces 506 on the bottom surface 124 of the layer 102. Traces 506 each terminate with a metal land 511, which serves as an input/output terminal of the package 500.

If desired, solder balls (not shown) may be provided on the lands 511. Of course, the form of the input/output terminals and the arrangement of the input/output terminals on the bottom surface 124 may vary (e.g. BGA, LGA, or LCC).

In addition, the lid 202' of FIG. 5, which is formed by severing the lid panel 202, may be electrically connected by a via 512 through the top layer 104 to the semiconductor die 210 through a trace 504. Alternatively, the lid 202' may be electrically connected by a combination of vias 512 and 510 through top and bottom layers 104 and 102, respectively, to input /output terminals (e.g., lands 511) on the bottom surface 124 of the bottom layer 102.

In the embodiment of FIG. 5, the lid 202' is circumscribed by beveled edges 404 and 406 that are sloped laterally outward. The beveled edges result from the notches 402 (see FIG. 4) optionally formed in the lid panel 202.

In accordance with one embodiment of the present invention, the semiconductor package 500 may be formed as follows. The ceramic substrate 100 is formed by attaching bottom and top layers 102 and 104 of ceramic material. Again, the bottom and top layers 102 and 104 may themselves be composed of multiple layers. The ceramic substrate 100 includes, as mentioned above, a matrix of sites for assembling a plurality of semiconductor packages, with each site including a cavity 106, input/output terminals (e.g., lands 511), and electrically conductive paths (e.g., traces 504, 506, and vias 510) extending from the cavity to the input/output terminals. Other electrically conductive paths may provide for electrical connectivity to the lid 202' later provided over the cavity 106 to the die 210 or input/output terminals (e.g., lands 511).

A region of the top surface 110 of the ceramic substrate 100 is then metallized, such as by nickel plating or screening, to provide a metal film 116 disposed on the top surface 110 and surrounding each of the cavities 106 formed in the substrate 100. Optionally, aligned pairs of metal lines 120 may be formed about a periphery portion 115 of the top surface 110 to facilitate saw alignment during later sawing. In addition, slots 122 may be formed in the bottom surface 124 of the substrate 100 to aid in later singulation of the substrate 100 into separate semiconductor packages. The formation of the slots 122 may be performed before the ceramic substrate 100 is fired.

Next, the semiconductor die 210 (FIGS. 4 and 5) is positioned within each of the cavities 106 and is electrically connected to the electrically conductive paths of the corresponding package site using bond wires or equivalent conductors (e.g., flip-chip connection).

Next, the metal lid panel 202 is provided. A thin layer of solder 302 is disposed, such as by plating or screening, on the bottom surface 206 of the lid panel 202. In one embodiment, the layer of solder 302 may have a thickness in the range of about 20–150 micro-inches. The metal lid panel 202 is then positioned on the metal film 116 of the ceramic substrate 100 over the openings of the cavities 106 so as to cover each of the cavity openings. The metal lid panel 202 may then be soldered to the metal film 116 by melting the solder layer 302, thereby sealing semiconductor die 210 within the respective cavities 106 to form an array of sealed semiconductor packages.

Optionally, the solder layer 302 may fuse to an upper end of a via 512 through top layer 104 at each package site, thereby forming an electrically conductive path between the metal lid panel 202 and semiconductor die 210 and/or input/output terminals of the package at each site.

A set of slots 402 may then be formed through the metal lid 202, the solder layer 302, and the metal film 116 to electrically isolate each of the semiconductor die 210. Accordingly, the packages may be electrically tested in matrix form before singulation.

Lastly, the semiconductor package array is divided into separate packages 500. The array may be divided by sawing transversely and longitudinally between the packages along the aligned pairs of lines 120, which may be aligned with the slots 122 formed on the bottom surface 124. The sawing cuts through the lid panel 202, the solder layer 302, and the substrate 100 where the slots 402 are not previously formed. Alternatively, the individual packages may be separated from the array by snapping along the slots 122 to form individual packages, such as the package 500.

The present apparatus and methods provide, among other things, sealed semiconductor packages that are thin and that may be fabricated easily without having unacceptable amounts of solder enter the cavity during the solder process.

While particular exemplary embodiments have been shown and described, it will be apparent to practitioners that various changes and modifications may be made without departing from this invention in its broader aspects. Accordingly, the appended claims encompass all such changes and modifications as fall within the scope of this invention.

What is claimed is:

1. A sealed ceramic semiconductor package, comprising:
   a ceramic substrate having planar top and bottom surfaces, the substrate having a cavity open at the substrate top surface;
   a semiconductor die disposed within the cavity and electrically coupled through the substrate to input/output terminals disposed adjacent the substrate bottom surface;
   a metal film disposed on the entire planar substrate top surface and around the cavity;
   a flat metal lid disposed over the cavity and metal film; and
   a layer of solder disposed between, coextensive with, and connecting all juxtaposed regions of the metal lid and the metal film;
   wherein the layer of solder is disposed over an entire area of a bottom surface of the metal lid and the lid has beveled edges entirely around the lid.

2. The sealed ceramic semiconductor package according to claim 1, wherein the lid is electrically coupled through the substrate and the layer of solder to at least one input/output terminal of the package.

3. The sealed ceramic semiconductor package according to claim 1, wherein the lid is electrically coupled through the substrate and the layer of solder to the semiconductor die.

4. A sealed ceramic semiconductor package, comprising:
   a ceramic substrate having planar first and second surfaces, the substrate having a cavity open at the substrate first surface;
   a semiconductor die disposed within the cavity;
   a metal film disposed on a major portion of the substrate first surface and around the cavity;
   a metal lid disposed over the cavity and metal film, the lid being electrically connected through the ceramic substrate to the semiconductor die; and
   a layer of solder disposed between and connecting juxtaposed regions of the metal lid and the metal film, wherein the lid has beveled edges entirely around the lid.

5. The sealed ceramic semiconductor package according to claim 4, wherein the semiconductor die is electrically coupled through the substrate to input/output terminals disposed adjacent the substrate second surface.

6. The sealed ceramic semiconductor package according to claim 4, wherein the layer of solder is disposed over an entire area of a second surface of the metal lid.

7. A sealed ceramic semiconductor package, comprising:
   a ceramic substrate having planar first and second surfaces, the substrate having a cavity open at the substrate first surface;
   a semiconductor die disposed within the cavity;
   a metal film disposed on a major portion of the substrate first surface and around the cavity;
   a metal lid disposed over the cavity and metal film;
   a layer of solder disposed between and connecting juxtaposed regions of the metal lid and the metal film;
   wherein the lid has beveled edges entirely around the lid.

8. The sealed ceramic semiconductor package according to claim 4, wherein the lid is electrically coupled through the substrate and the layer of solder to at least one input/output terminal of the package.

9. The sealed ceramic semiconductor package according to claim 4, wherein the layer of solder completely covers a surface of the metal lid.

10. The sealed ceramic semiconductor package according to claim 4, wherein the layer of solder includes an aperture over the cavity.

11. A sealed ceramic semiconductor package, comprising:
    a ceramic substrate having planar first and second surfaces, the substrate having a cavity open at the substrate first surface;
    a semiconductor die disposed within the cavity and electrically coupled through the substrate to input/output terminals disposed adjacent the substrate second surface;
    a metal film disposed on a major portion of the planar substrate first surface and around the cavity;
    a flat metal lid having first and second surfaces disposed over the cavity and metal film, the flat metal lid being electrically coupled through the substrate to at least one of the input/output terminals; and
    a layer of solder disposed over an entire second surface of the metal lid connecting all juxtaposed regions of the metal lid and the metal film, wherein the lid has beveled edges entirely around the lid.

12. The sealed ceramic semiconductor package according to claim 11, wherein the lid is electrically coupled through the substrate and the layer of solder to the semiconductor die.

13. The sealed ceramic semiconductor package according to claim 1, wherein the lid is electrically coupled through the substrate and the layer of solder to an array of input/output terminals of the package.

14. The sealed ceramic semiconductor package according to claim 1, further comprising an array of input/output terminals on the planar bottom surface of the ceramic substrate.

15. The sealed ceramic semiconductor package according to claim 4, further comprising an array of input/output terminals on the second surface of the substrate and electrically coupled to the semiconductor die.

16. The sealed ceramic semiconductor package according to claim 7, further comprising an array of input/output terminals on the second surface of the substrate and electrically coupled to the semiconductor die.

17. The sealed ceramic semiconductor package according to claim 7, further comprising an array of input/output terminals on the second surface of the substrate and electrically coupled to the metal lid.

18. The sealed ceramic semiconductor package according to claim 11, wherein the input/output terminals are disposed in an array on the second surface of the substrate.

19. The sealed ceramic semiconductor package according to claim 11, wherein the input/output terminals are disposed in an array on the second surface of the substrate, each of the input/output terminals being electrically coupled to the semiconductor die.

* * * * *